(12) United States Patent
Shin et al.

(10) Patent No.: US 9,799,852 B2
(45) Date of Patent: Oct. 24, 2017

(54) ORGANIC LIGHT EMITTING DIODE AND METHOD OF FABRICATING THE SAME

(71) Applicant: ELECTRONICS AND TELECOMMUNICATIONS RESEARCH INSTITUTE, Daejeon (KR)

(72) Inventors: Jin Wook Shin, Daejeon (KR); Jonghee Lee, Daejeon (KR); Jeong Ik Lee, Daejeon (KR); Hyunsu Cho, Daejeon (KR); Jun-Han Han, Daejeon (KR); Jaehyun Moon, Daejeon (KR); Nam Sung Cho, Daejeon (KR); Doo-Hee Cho, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/942,510

(22) Filed: Nov. 16, 2015

(65) Prior Publication Data

US 2016/0164038 A1 Jun. 9, 2016

(30) Foreign Application Priority Data

Dec. 9, 2014 (KR) .......................... 10-2014-0176126
Sep. 10, 2015 (KR) .......................... 10-2015-0128498

(51) Int. Cl.
*H01L 51/52* (2006.01)
*H01L 51/56* (2006.01)

(52) U.S. Cl.
CPC ...... *H01L 51/5268* (2013.01); *H01L 51/5253* (2013.01); *H01L 51/56* (2013.01); *H01L 2251/5369* (2013.01)

(58) Field of Classification Search
CPC .. H01L 51/5268; H01L 51/56; H01L 51/5253
USPC .......................................................... 257/40
See application file for complete search history.

(56) References Cited

U.S. PATENT DOCUMENTS

| 2010/0024869 A1* | 2/2010 | Wang | ............... | H01L 31/028 136/249 |
| 2013/0181242 A1* | 7/2013 | Cho | ............... | H01L 51/0096 257/98 |
| 2013/0193416 A1* | 8/2013 | Shin | ............... | H01L 51/50 257/40 |

FOREIGN PATENT DOCUMENTS

| KR | 10-2014-0116299 A | 10/2014 |
| KR | 10-1466831 B1 | 11/2014 |

* cited by examiner

*Primary Examiner* — Fernando L Toledo
*Assistant Examiner* — Adam S Bowen

(57) ABSTRACT

Provided is an organic light emitting diode including a substrate, a light scattering structure including nano-structures on the substrate, a thin film on the nano-structures, and an air gap between the nano-structures, a planarizing layer covering the thin film and thicker than the thin film, a first electrode on the planarizing layer, an organic emission layer on the first electrode, and a second electrode on the organic emission layer.

9 Claims, 6 Drawing Sheets

ORGANIC LIGHT EMITTING DIODE AND METHOD OF FABRICATING THE SAME

CROSS-REFERENCE TO RELATED APPLICATIONS

This U.S. non-provisional patent application claims priority under 35 U.S.C. §119 of Korean Patent Application Nos. 10-2014-0176126, filed on Dec. 9, 2014, and 10-2015-0128498, filed on Sep. 10, 2015, the entire contents of which are hereby incorporated by reference.

BACKGROUND

The present disclosure herein relates to an organic light emitting diode and a method of fabricating the same, and more particularly, an organic light emitting diode including a light scattering structure and a method of fabricating the same.

An organic light emitting diode is a self-light emitting device electrically exciting an organic light-emitting material to emit light. The organic light emitting device includes a substrate, a first electrode, a second electrode, and an organic emission layer formed between the first and second electrodes. The organic emission layer generates light by a combination of holes and electrons supplied from the first and second electrodes. The organic light emitting diode is a self-light emitting device and has a wide viewing angle, a fast response rate, and high color reproducibility. The organic light emitting diode has been applied to a display device. Recently, research on applying the organic light emitting diode to lighting is in progress.

Elements such as a substrate, a light scattering layer, and an organic emission layer are stacked to form the organic light emitting diode. The light generated in the organic emission layer must pass through an interface between heterogeneous materials and material films with refractive indexes different from each other to be visibly recognized. Due to the interface between heterogeneous materials and the different refractive indexes of the heterogeneous materials, the generated light is guided or totally reflected. Due to such an optical structure, most of the light generated in the organic light-emitting diode is lost. Only a small fraction (up to about 20%) of the generated light emits from the diode to be visually recognized from outside.

SUMMARY

The present disclosure provides an organic light emitting diode with enhanced light extraction efficiency.

The present disclosure also provides a method of fabricating an organic light emitting diode with more improved reliability.

The object of the inventive concept is not limited to the aforesaid, but other objects not described herein will be clearly understood by those skilled in the art from descriptions below.

An embodiment of the inventive concept provides an organic light emitting diode including a substrate, a light scattering structure including nano-structures on the substrate, a thin film on the nano-structures, and an air gap between the nano-structures, a planarizing layer covering the thin film and thicker than the thin film, a first electrode on the planarizing layer, an organic emission layer on the first electrode, and a second electrode on the organic emission layer.

In an embodiment, the nano-structures may have a particle shape or a line shape.

In an embodiment, the nano-structures may have a width ranging from about 50 nm to about 3000 nm and a distance therebetween ranging from about 50 nm to about 3000 nm.

In an embodiment, the thin film may include any one of graphene, molybdenum disulfide, or tungsten sulfide.

In an embodiment, the thin film may have a thickness ranging from about 0.1 nm to about 10 nm and the planarizing layer may have a thickness ranging from about 1 nm to about 100 nm.

In an embodiment of the inventive concept, a method of fabricating an organic light emitting diode includes forming nano-structures on a substrate, transferring a thin film on the nano-structures to form an air gap between the nano-structures, forming a planarizing layer covering the thin film, forming a first electrode on the planarizing layer, and forming an organic emission layer on the first electrode.

In an embodiment, transferring the thin film on the nano-structures may include growing the thin film on a seed film, separating the thin film from the seed film, transferring the thin film on the nano-structures, and heat treating the thin film.

In an embodiment, the planarizing layer may be formed thicker than the thin film.

In an embodiment, the thin film may include any one of graphene, molybdenum disulfide, and tungsten sulfide.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
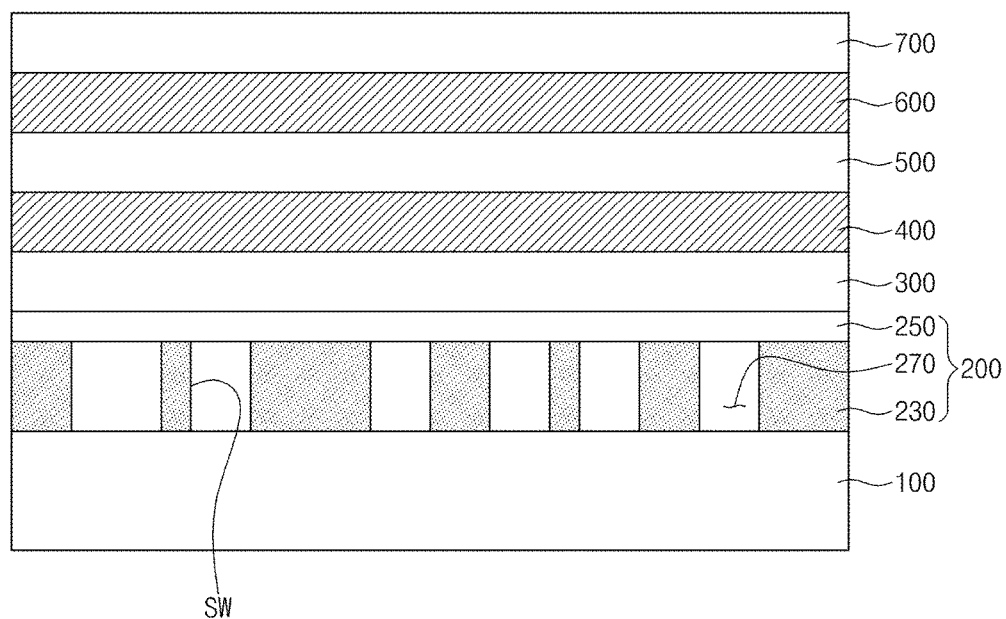
FIG. 1 illustrates a sectional view of an organic light emitting diode according to an embodiment of the inventive concept.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals refer to like elements throughout.

In the following description, the technical terms are used only for explaining a specific exemplary embodiment while not limiting the present invention. The terms of a singular form may include plural forms unless referred to the contrary. The meaning of "include," "comprise," "including," or "comprising," specifies mentioned components, steps, operations and/or elements but does not exclude other components, steps, operations and/or elements.

Additionally, the embodiment herein will be described with sectional views and/or plan views as ideal exemplary views of the present invention. In the figures, the dimensions of layers and regions are exaggerated for an effective description of technical content. As such, variations from the shapes of the illustrations as a result, for example, of manufacturing techniques and/or tolerances, are to be expected. Therefore, the embodiments of the present invention are not limited to the specific shape illustrated in the exemplary views, but may include other shapes that may be created according to manufacturing processes. For example, an etched region illustrated as a right angle may have rounded or curved features. Areas exemplified in the drawings have general properties, and are used to illustrate a specific shape of a device region. Thus, this should not be construed as limited to the scope of the present invention.

FIG. 1 illustrates a sectional view of an organic light emitting diode according to an embodiment of the inventive concept.

Referring to FIG. 1, a light scattering structure 200, a planarizing layer 300, a first electrode 400, an organic emission layer 500, a second electrode 600, and a protective layer 700 may be sequentially stacked on a substrate 100.

The substrate 100 may be a transparent substrate. The substrate 100 may be an inorganic substrate including one selected from the group consisting of, for example, glass, silicon oxide ($SiO_2$), silicon nitride (SiN), silicon (Si) and titanium dioxide ($TiO_2$), and a combination thereof. The substrate 100 may be a flexible substrate that may be curved. The substrate 100 may be an organic substrate including one selected from the group consisting of, for example, polyimide, polyethylene terephthalate (PET) and/or polyacrylate, polyethylene naphthalate (PEN) and a combination thereof.

The light scattering structure 200 may be disposed on the substrate 100. The light scattering structure 200 may control a light path of light incident without dependency on a specific wavelength through effects of scattering, diffused reflection, refraction, and diffraction. The light scattering structure 200 may include nano-structures 230 and a thin film 250 which are sequentially stacked on the substrate 100.

Figure 2A:
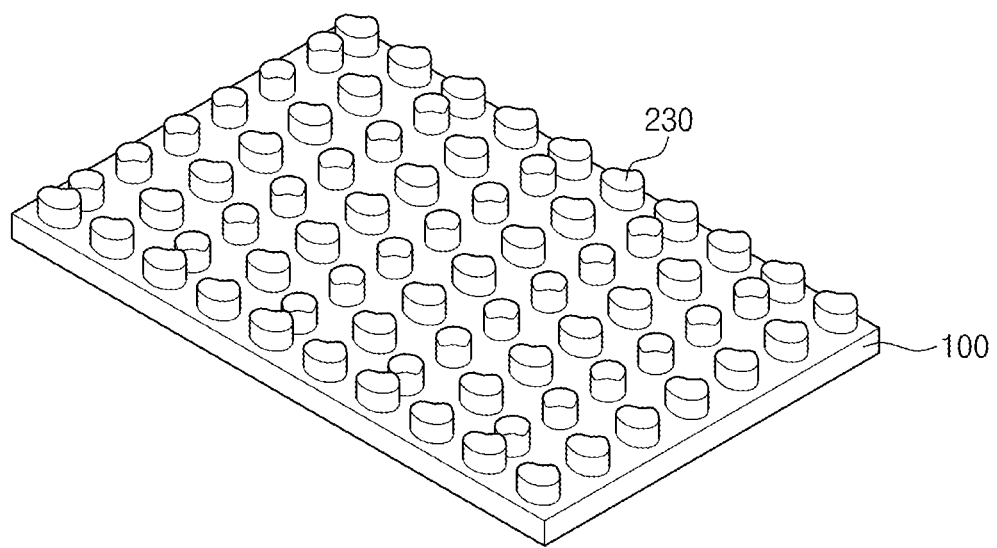
FIGS. 2A to 2B illustrate perspective views illustrating nano-structures of a light scattering structure in FIG. 1, and FIGS. 3 to 9 illustrate cross-sectional views illustrating a method of fabricating an organic light emitting device according to an embodiment of the inventive concept.
Figure 2B:
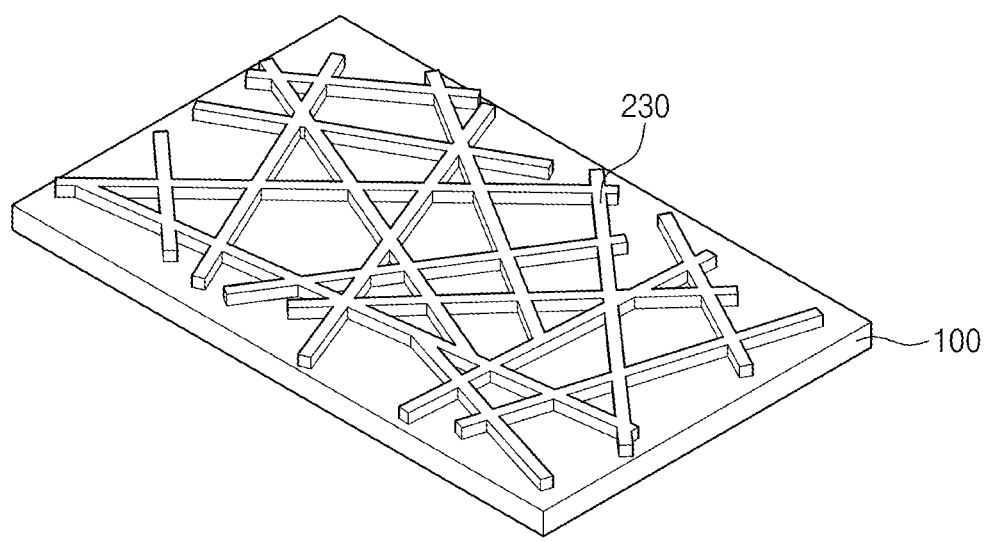

Referring to FIGS. 2A and 2B, when viewed from above, the nano-structures 230 may have a particle shape or a line shape. The nano-structures 230 may be regularly or irregularly arranged on the substrate 100 and a size of the nano-structures 230 may be also regular or irregular. Specifically, referring to FIG. 2A, the nano-structures 230 having the particle shape may be uniformly arranged. When viewed from above, the nano-structures 230 may have, for example, a circular shape, an oval shape, a capsule shape, or a concave circular shape. Referring to FIG. 2B, the nano-structures 230 having a line shape may cross each other and be randomly arranged.

When the nano-structures 230 have a regular size and a regular arrangement, incident light may have a dependency on a specific wavelength.

The nano-structures 230 may have a uniform or non-uniform width. For example, the nano-structures 230 may have a width ranging from about 50 nm to about 3000 nm. The nano-structures 230 may be spaced apart from each other at a predetermined distance. For example, the nano-structures 230 may be spaced apart from each other at a distance ranging from about 50 nm to about 3000 nm. The nano-structures 230 may include at least one of transparent materials. For example, the nano-structures 230 may include one selected from the group consisting of oxides such as $SiO_2$, $SnO_2$, $TiO_2$, $TiO_2$—$SiO_2$, $ZrO_2$, $Al_2O_3$, $HfO_2$, $In_2O_3$, and ITO, a nitride such as SiNx, and resins such as a polyethylene resin, a polyacrylic resin, a polyvinyl chloride (PVC) resin, a polyvinylpyrrolidine resin, a polyimide resin, a polystyrene resin, and an epoxy resin, and a combination thereof. For another example, the nano-structures 230 may be fabricated by using a substrate itself as a medium layer.

Referring back to FIG. 1, the thin film 250 may be disposed on the nano-structures 230. The thin film 250 may be a film directly transferred on the nano-structures 230. For example, the thin film 250 may include any one of graphene, molybdenum disulfide ($MoS_2$), and tungsten sulfide ($WS_2$). The thin film 250 may have a thickness ranging from about 0.1 nm to about 10 nm.

The light scattering structure 200 may include an air gap 270. The air gap 270 is a region to which a solid material is not provided and may be a substantially empty space. For example, the air gap 270 may be a region filled with air. The air gap 270 may be disposed between the nano-structures 230. In general, when a difference in refractive index between the nano-structures 230 and a medium surrounding the nano-structures 230 becomes greater, light extraction efficiency of the light-scattering structure 200 may be increased. According to an embodiment, since the air gap 270 made up of air with the refractive index of 1 is disposed between the nano-structures 230, the light-scattering structure 200 with enhanced light extraction efficiency may be provided.

The planarizing layer 300 may be disposed on the thin film 250. The planarizing layer 300 may cover a top surface of the thin film 250 and may be spaced apart from side walls SW of the nano-structure 230. The planarizing layer 300 may be thicker than the thin film 250. For example, the planarizing layer 300 may have a thickness ranging from about 1 nm to about 100 nm. The planarizing layer 300 may have a refractive index same as or higher than those of nano-structures 230 and the first electrode 400. For example, the planarizing layer 300 may have a refractive index ranging from about 1.0 to about 2.5. The planarizing layer 300 may be an insulating layer. The planarizing layer 300 may include an inorganic material, for example, $TiO_2$, $ZrO_2$, ZnS, $TiO_2$—$SiO_2$, $SnO_2$, and $In_2O_3$. Alternatively, the planarizing layer 300 may be a composite including, for example, a polymer such as a polyvinyl phenol resin, an epoxy resin, a polyimide resin, a polystyrene resin, a polycarbonate resin, a polyethylene resin, a PMMA resin, and a polypropylene resin, and an inorganic material. The planarizing layer 300 may be disposed on the thin film 250 to enhance mechanical or chemical strength of the thin film 250. In addition, the planarizing layer 300 may have a function of protecting the thin film 250 from a subsequent process.

The first electrode 400 may be disposed on the planarizing layer 300. The first electrode 400 may be a transparent anode electrode. Therefore, the first electrode 400 may receive a voltage from outside to supply holes to the organic emission layer 500. The first electrode 400 includes one selected from the group consisting of an oxide-based material, a polymer-based material, a carbon-based material, a metal-based material, a synthetic polymer, and a combination thereof. In detail, the first electrode 400 may include (PEDOT:PSS) (poly(3,4-ethylenedioxythiophene):poly(4-styrenesulfonate), polyacetylene, poly-(p-phenylene), polythiophene, poly(ethylenedioxythiophene), polypyrrole, poly(p-phenylene vinylene), poly(thienylene vinylene), polyaniline, polyisothianaphthene, or poly(p-phenylene sylfide). In another example, the first electrode 400 may include an indium tin oxide (ITO) or an indium zinc oxide (IZO). For another example, the first electrode 400 may include graphene, molybdenum disulfide, or tungsten sulfide.

The organic emission layer 500 may be disposed on the first electrode 400. The organic emission layer 500 may generate light through recombination of holes supplied from the first electrode 400 and electrons supplied from the second electrode 400. The organic emission layer 500 may further include an auxiliary layer (not shown) enhancing light emitting efficiency of the organic emission layer 500. The auxiliary layer may include at least one of a hole injecting layer, a hole transfer layer, an electron transfer layer, or an electron injecting layer.

The organic emission layer 500 may include at least one of organic light emitting materials. For example, the organic emission layer 500 may include one selected from the group consisting of a polyfluorene derivative, a (poly) paraphenylenevinylene derivative, a polyphenylene derivative, a polyvinylcarbazole derivative, a polythiophene derivative, an anthracene derivative, a butadiene derivative, a tetracene derivative, a distyrylarylene derivative, a benzazole derivative, and carbazole. According to other examples, the organic emission layer 500 may include an organic light emitting material including a dopant. For example, the dopant may include one selected from the group consisting of xanthene, perylene, cumarine, rhodamine, rubrene, dicyanomethylenepyran, thiopyran, (thia) pyrilium, a periflanthene derivative, an indenoperylene derivative, carbostyryl, Nile red, and quinacridone. The organic light emitting material may include one selected from the group consisting of a polyfluorene derivative, a (poly) paraphenylene vinylene derivative, a polyphenylene derivative, a polyvinyl carbazole derivative, a polythiophene derivative, an anthracene derivative, a butadiene derivative, a tetracene derivative, a distyrylarylene derivative, a benzazole derivative, and carbazole.

The second electrode 600 may be disposed on the organic emission layer 500. The second electrode 600 may be a cathode electrode. The second electrode 600 may receive a voltage from outside to supply electrons to the organic emission layer 500. The second electrode 600 may allow light generated from the organic emission layer 500 to pass therethrough or to be reflected therefrom toward the first electrode 400. The second electrode 600 may include a conductive material such as a metal material or a light transmissive conductive material. The metal material may be, for example, aluminum (Al), silver (Ag), magnesium (Mg), molybdenum (Mo), or an alloy thereof. The light transmissive conductive material may be, for example, an indium tin oxide (ITO). A wavelength of light passing through the second electrode 600 may be varied according to the thickness of the second electrode 600.

The protective layer 700 may be disposed on the second electrode 600. The protective layer 700 may have a function of protecting the organic emission layer 500. The protective layer 700 may be a sealed protective layer or packaged glass plate. The protective layer 700 may include an air-impermeable material or a transparent material.

FIGS. 3 to 9 illustrate cross-sectional views illustrating a method of fabricating an organic light emitting device according to an embodiment of the inventive concept.

Figure 3:
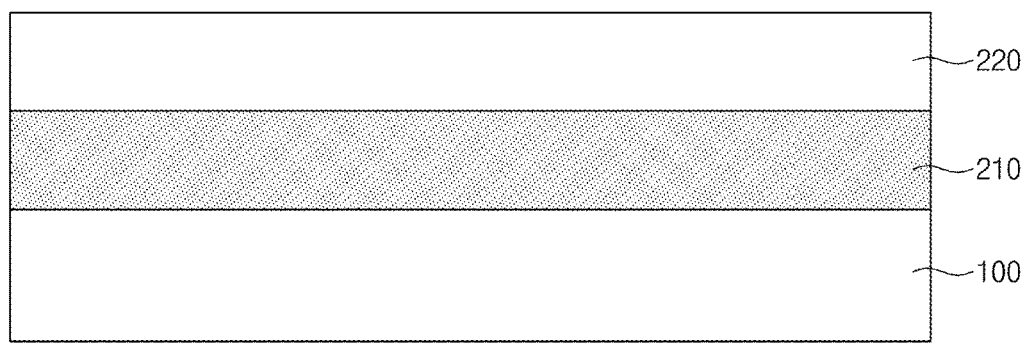

Referring to FIG. 3, a light scattering medium layer 210 and a metal thin film layer 220 may be sequentially formed on a substrate 100. The substrate 100 may be washed before the light scattering medium layer 210 is formed. The washing may be performed by using distilled water, an organic solvent, a base solution, or an acid solution. The light scattering medium layer 210 may be formed, for example, by any one of a physical vapor deposition (PVD), a chemical vapor deposition (CVD), an electron beam evaporation (E-beam evaporation), a thermal deposition, and/or an atomic layer deposition (ALD). The light scattering medium layer 210 may include a material with a refractive index greater than that of the substrate 100. For example, the light scattering medium layer 210 may include one selected from the group consisting of oxides such as $SiO_2$, $SnO_2$, $TiO_2$, $TiO_2$—$SiO_2$, $ZrO_2$, $Al_2O_3$, $HfO_2$, $In_2O_3$, and an indium tin oxide (ITO), a nitride such as SiNx, and resins such as a polyethylene-based resin, a polyacrylic resin, a polyvinyl chloride (PVC) resin, a polyvinylpyrrolidine (PVP) resin, a polyimide resin, a polystyrene resin, an epoxy resin and a combination thereof. The light scattering medium layer 210 may be formed so as to have a thickness ranging from about 50 nm to about 1000 nm. In another example, the substrate 100 itself may be used as the light scattering medium layer 210 without depositing of an additional material thereon.

A metal thin film layer 220 may be formed on the light scattering medium layer 210. The metal thin film layer 220 may be formed by deposition or coating. For example, the metal thin film layer 220 may be formed by any one of a physical vapor deposition (PVD), a chemical vapor deposition (CVD), an electron beam evaporation (E-beam evaporation), a thermal deposition, and/or an atomic layer deposition (ALD). The metal thin film layer 220 may include a material having resistance to dry etching. For example, the metal thin film layer 220 may include any one selected from the group consisting of a metal (e.g., platinum, gold, silver, copper, nickel, chromium, tungsten, zinc, tin, titanium, zirconium, aluminum, and/or combinations thereof), a ceramic material (e.g., $Al_2O_3$) and/or an organic compound (a photoresist (e.g., poly(methyl methacrylate); PMMA, (poly(dimethylglutarimide); PMGI), and a combination thereof. The metal thin film layer 220 may be formed so as to have a thickness ranging from about 10 nm to about 100 nm. When the metal thin film layer 220 is thinly deposited, the metal thin film layer 220 may have, instead of a layer shape, a particle shape or island shape in which particles or islands are separated from each other.

Figure 4:
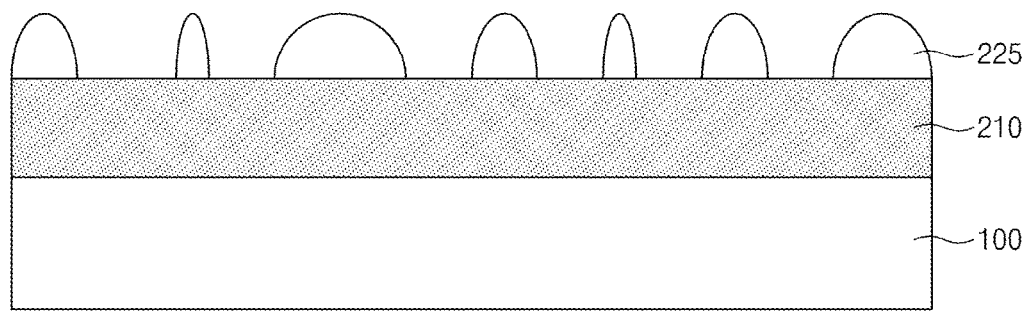

Referring to FIG. 4, an etch mask 225 exposing a portion of the light scattering medium layer 210 may be formed on the light scattering medium layer 210. A heat treatment process may be performed on the metal thin film layer 220 in order to form the etch mask 225. An oven or a hot-plate may be used in the heat treatment process. The heat treatment process may be performed by using thermal annealing or rapid thermal annealing (RTA). The heat treatment process may be performed in a range of a softening point temperature or below of the substrate 100. For example, the heat treatment process may be performed at about a temperature from a room temperature (25° C.) to 250° C.

The etch mask 225 may be modified in order to expose the light-scattering medium layer 210 by a dewetting phenomenon. The dewetting phenomenon may refer to causing dewettability on a film by performing a heat-treatment on a film including a material with dewettability to form a uniform or non-uniform pattern. An average diameter and an average thickness of the etch mask 225 may be controlled by a process condition. For example, the etch mask 225 may have a size ranging from about 50 nm to about 3000 nm.

Figure 5:
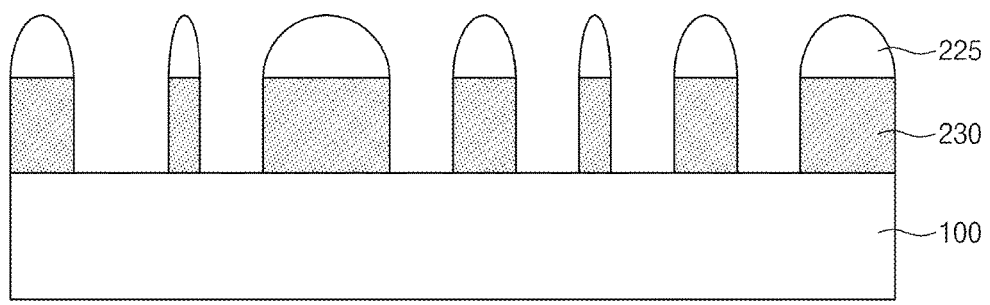

Referring to FIG. 5, the light scattering medium layer 210 exposed by the etch mask 225 may be etched to form nano-structures 230. The nano-structures 230 may be formed by a dry etching process using reactive ion etching (RIE) or inductively coupled plasma (ICP). (Referring to FIG. 2A)

For another example, the nano-structures 230 may be formed by an imprint lithography method. In detail, a mold having a shape is fabricated and then heat and pressure may be applied to a polymer layer (not shown) on the substrate 100 to form the nano-structures 230. (see FIG. 2A)

For another example, a bead, a nano-wire, or the like which has a greater etching selectivity than the substrate 100 or the light scattering medium layer 210 may be coated on the substrate 100. The substrate 100 may be etched by using the coated bead or the coated nano-wire as an etching mask and then the bead and nano-wire may be removed to form the nano-structures 230. (Referring to FIG. 2B)

The nano-structures 230 may be formed so as to have uniform or non-uniform pattern. When viewed from above, the nano-structures 230 may be formed, for example, in a particle shape (referring to FIG. 2A) or a line shape (referring to FIG. 2B). When viewed in cross-section, the nano-structures 230 may have a cross-section of a rectangular shape, a trapezoidal shape, or a circular shape.

Figure 6:
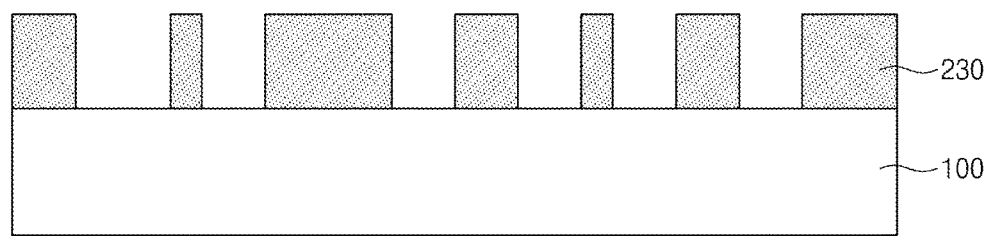

Referring to FIG. 6, the etch mask 225 may be removed. The etch mask 225 may be removed by using an etching solution. For example, the etching solution may include a nitric acid ($HNO_3$), a sulfuric acid ($H_2SO_4$), aquaregia ($HCl:HNO_3$), a phosphoric acid ($H_3PO_4$), and the like. The etching solution (acid) may remove the etch mask 225 without etching the nano-structure 230.

Figure 7:
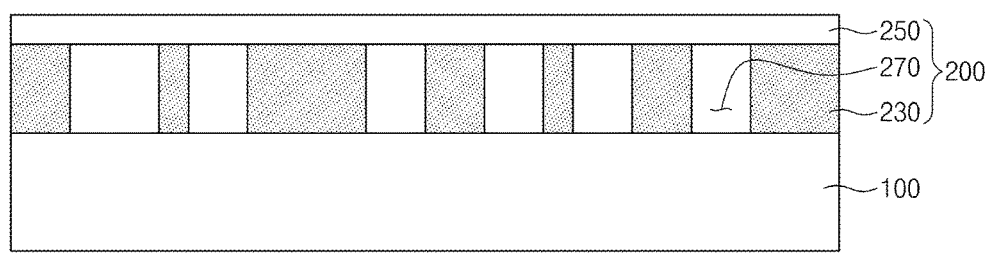

Referring to FIG. 7, a prepared thin film 250 may be provided on the nano-structures 230. The thin film 250 may be provided by being directly transferred on the nano-structures 230. Providing the thin film 250 on the nano-structures 230 may include forming the thin film 250 on a seed film (i.e., nickel (Ni) film or a copper (Cu) film) through an additional process, transferring the thin film 250 separated from the seed film on the nano-structures 230, and heat-treating the thin film 250. At this time, the seed film may be a metal thin film provided to a deposition equipment. For another example, the thin film 250 may be provided through a roll-to-roll transfer process. The roll-to-roll transfer process may include bonding the thin film 250 formed on the seed film to a heat releasable tape through an adhesive roller, removing the seed film through the etch solution, and providing a thin film on the nano-structures 230 through a transfer roller. The thin film 250 may include any one of graphene, molybdenum disulfide ($MoS_2$), and tungsten sulfide ($WS_2$). In more detail, the thin film 250 may be formed by graphene, a molybdenum disulfide ($MoS_2$), or a tungsten sulfide ($WS_2$) which has a two-dimensional structure. The thin film 250 may have a thickness ranging from about 0.1 nm to about 10 nm.

An air gap 270 may be formed between the nano-structures 230 by providing the thin film 250 on the nano-structures 230. In detail, the air gap 270 may be filled with air and may be defined by a top surface of the substrate 100, side walls SW of the adjacent nano-structures 230, and a bottom surface of the thin film 250. The nano-structures 230, the air gap 270 (refractive index: about 1), and the thin film 250 may constitute the light-scattering structure 200. The light scattering structure 200 including the air gap 270 may optimize a difference in refractive index between the nano-structures 230. Therefore, extraction efficiency of the organic light emitting diode may be enhanced.

Figure 8:
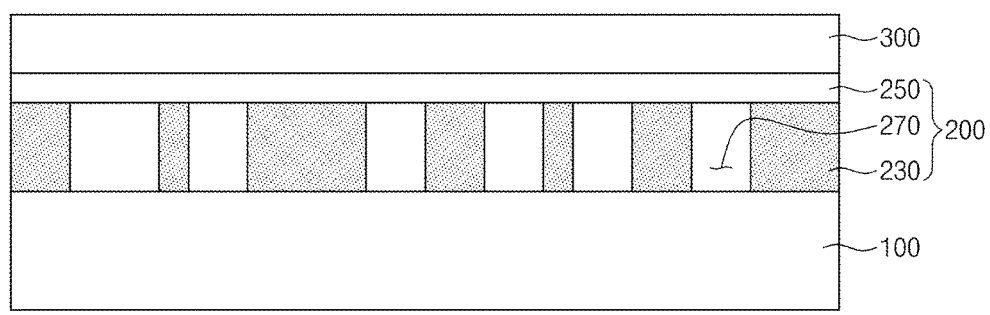

Referring to FIG. 8, a planarizing layer 300 may be formed on the thin film 250. The planarizing layer 300 may not be filled with the air gap 270. The planarizing layer 300 may be formed in order to be thin enough not to lower a light scattering function of the light scattering structure 200. For example, the planarizing layer 300 may have a thickness ranging from about 1 nm to about 100 nm. The planarizing layer 300 may be transparent and may be formed of a material having a refractive index ranging from about 1.0 to about 2.5. For example, the planarizing layer 300 may include an inorganic material such as $TiO_2$, $ZrO_2$, ZnS, $TiO_2$—$SiO_2$, $SnO_2$, and $In_2O_3$. For another example, the planarizing layer 300 may be a composite including, for example, a polymer such as a polyvinyl phenol resin, an epoxy resin, a polyimide resin, a polystyrene resin, a polycarbonate resin, a polyethylene resin, a PMMA resin, or a polypropylene resin, and an inorganic material.

The planarizing layer 300 may be formed, for example, by any one of a physical vapor deposition (PVD), a chemical vapor deposition (CVD), an electron beam evaporation (E-beam evaporation), a thermal deposition, and/or an atomic layer deposition (ALD). For another example, the planarizing layer 300 may be formed on the thin film 250 by using any one of a spin coating method, a dip coating method, or a spray coating method. When the coating method is used to form the planarizing layer 300, a liquid phase material may be used. For example, when an inorganic material is used to form the planarizing layer 300, a precursor may be used by a sol-gel process. For another example, when a composite of a polymer and an inorganic material is used to form the planarizing layer 300, nano-particles are dispersed in a solvent and then a monomer or a polymer is added thereto to use a liquid phase composite. A liquid phase film coated on the thin film 250 may be heat treated or irradiated with ultraviolet rays to be cured.

As described above, the light-scattering structure 200 including the air gap 270 composed of air has to be formed in order to enhance light scattering efficiency of the light-scattering structure 200. In order to form the air gap 270 between the nano-structures 230, a film to be able to be transferred on the nano-structure 230 has to be provided. This is because, when a thin film is formed on the nano-structures 230 through a deposition process, a deposition material fills a space between the nano-structures 230. In other words, the air gap 270 is not provided between the nano-structures 230. However, the thin film 250 may have low mechanical or chemical strength due to a small thickness thereof. According to an embodiment of the inventive concept, the planarizing layer 300 may be formed on the thin film 250 to enhance mechanical or chemical strength of the thin film 250. In addition, the planarizing layer 300 over the air gap 270 may play a role of protecting the thin film 250 in a subsequent process.

Figure 9:
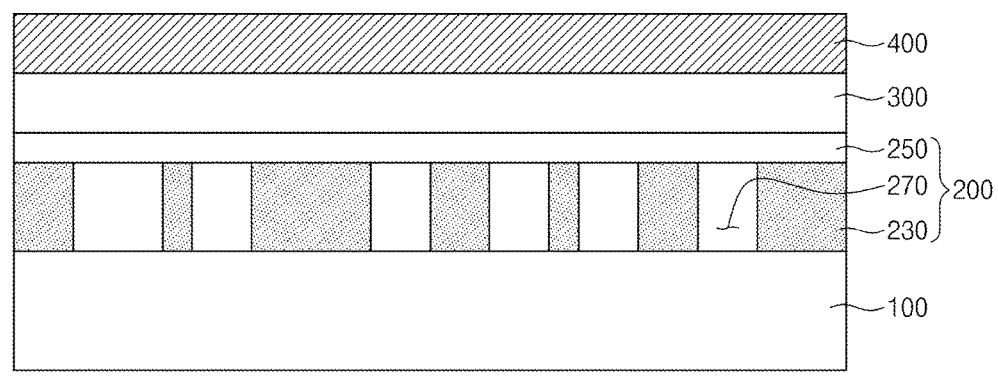

Referring to FIG. 9, a first electrode 400 may be formed on the planarizing layer 300. The first electrode layer 400 may be a transparent anode electrode. The first electrode 400 may be formed in order to include one selected from the group consisting of an oxide-based material, a polymer-based material, a carbon-based material, a metal-based material, and a synthetic polymer. In detail, a conducting polymer may include (PEDOT:PSS) (poly(3,4-ethylenedioxythiophene):poly(4-styrenesulfonate), polyacetylene, poly-(p-phenylene), polythiophene, poly(ethylenedioxythiophene), polypyrrole, poly(p-phenylene vinylene), poly (thienylene vinylene), polyaniline, polyisothianaphthene, poly(p-phenylene sylfide), and the like. A transparent conductive oxide (TCO) may include an indium tin oxide (ITO) and an indium zinc oxide (IZO). The first electrode 400 may include graphene, molybdenum disulfide ($MoS_2$), and tungsten sulfide ($WS_2$).

Referring back to FIG. 1, an organic emission layer 500, a second electrode 600, and a protective layer 700 may be sequentially formed on the first electrode 400. The organic emission layer 500 may be formed by any one of chemical vapor deposition (CVD), physical vapor deposition (PVD), and electron beam evaporation (E-beam evaporation) methods. The organic emission layer 500 may generate light through recombination of holes provided from the first electrode 400 and electrons provided from the second electrode 600. Light generated from the light emission layer 500 is partially or totally reflected by the substrate 100 and is guided into the first electrode 400 and the organic emission layer 500. The light guided into the organic emission layer 500 may not be emitted to the substrate 100.

The organic emission layer 500 may include at least one of organic light-emitting materials. For example, the organic emission layer 500 may include at least one selected from the group consisting of a polyfluorene derivative, a (poly) paraphenylenevinylene derivative, a polyphenylene derivative, a polyvinylcarbazole derivative, a polythiophene derivative, an anthracene derivative, a butadiene derivative, a tetracene derivative, a distyrylarylene derivative, a benzazole derivative, carbazole, and a combination thereof. According to other examples, the organic emission layer 500 may include an organic light emitting material including a dopant. For example, the dopant may include any one selected from the group consisting of xanthene, perylene, cumarine, rhodamine, rubrene, dicyanomethylenepyran, thiopyran, (thia) pyrilium, a periflanthene derivative, an indenoperylene derivative, carbostyryl, Nile red, quinacridone, and a combination thereof. The organic light emitting material may include at least one selected from the group consisting of a polyfluorene derivative, a (poly) paraphenylenevinylene derivative, a polyphenylene derivative, a polyvinylcarbazole derivative, a polythiophene derivative, an anthracene derivative, a butadiene derivative, a tetracene derivative, a distyrylarylene derivative, a benzazole derivative, carbazole, and a combination thereof.

The second electrode 600 may be a cathode electrode. The second electrode 600 may receive a voltage from outside to provide electrons to the organic emission layer 500. The second electrode 600 may allow light generated from the organic emission layer 500 to pass therethrough or to be reflected therefrom toward the first electrode 400. The second electrode 600 may be formed of a conductive material such as a metal or light transmissive conductive material. The metal material may be, for example, aluminum (Al), silver (Ag), magnesium (Mg), molybdenum (Mo), or an alloy thereof. The transparent conductive material may be an indium tin oxide (ITO). A wavelength of light passing through the second electrode 600 may be varied according to the thickness of the thin film.

The protective layer 700 may protect the organic emission layer 500. The protective layer 700 may be a sealed protective layer or packaged glass plate.

The organic light emitting diode according to an embodiment of inventive concept may include a light scattering structure including nano-structures, a thin film on the nano-structures, and a planarizing layer covering the thin film. The planarizing layer on the thin film is formed thicker than the thin film to enhance mechanical and chemical strength of the thin film having a small thickness. In addition, the planarizing layer may have a function of protecting the thin film from a subsequent process.

While the present disclosure has been particularly shown and described with reference to exemplary embodiments thereof, it will be understood by those of ordinary skill in the art that various changes in form and details may be made therein without departing from the spirit and scope of the present disclosure. Accordingly, the exemplary embodiments should be construed in descriptive sense only and not for purposes of limitation.

What is claimed is:

1. An organic light emitting diode comprising:
   a substrate;
   a light scattering structure including nano-structures on the substrate, a thin film on the nano-structures, and an air gap between the nano-structures;
   a planarizing layer covering the thin film and thicker than the thin film;
   a first electrode on the planarizing layer;
   an organic emission layer on the first electrode; and
   a second electrode on the organic emission layer.

2. The organic light emitting diode of claim 1, wherein the nano-structures have a particle shape or a line shape.

3. The organic light emitting diode of claim 1, wherein the nano-structures have a width ranging from 50 nm to 3000 nm and a distance therebetween ranging from 50 nm to 3000 nm.

4. The organic light emitting diode of claim 1, wherein the thin film comprises any one of graphene, molybdenum disulfide, or tungsten sulfide.

5. The organic light emitting diode of claim 1, wherein the thin film has a thickness ranging from 0.1 nm to 10 nm and the planarizing layer has a thickness ranging from 1 nm to 100 nm.

6. A method of fabricating an organic light emitting diode, the method comprising:
   forming nano-structures on a substrate;
   transferring a thin film on the nano-structures to form an air gap between the nano-structures;
   forming a planarizing layer covering the thin film;
   forming a first electrode on the planarizing layer; and
   forming an organic emission layer on the first electrode.

7. The method of claim 6, wherein transferring the thin film on the nano-structures comprises:
   growing the thin film on a seed film;
   separating the thin film from the seed film;
   transferring the thin film on the nano-structures; and
   heat-treating the thin film.

8. The method of claim 6, wherein the planarizing layer is formed thicker than the thin film.

9. The method of claim 6, wherein the thin film comprises any one of graphene, molybdenum disulfide, and tungsten sulfide.

* * * * *